United States Patent
Nitta

(10) Patent No.: US 12,218,169 B2
(45) Date of Patent: Feb. 4, 2025

(54) SEMICONDUCTOR DEVICE AND SOLID-STATE IMAGE SENSOR INCLUDING PIXEL SUBSTRATE JOINED WITH ANOTHER SUBSTRATE

(71) Applicant: SONY SEMICONDUCTOR SOLUTIONS CORPORATION, Kanagawa (JP)

(72) Inventor: Yosuke Nitta, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 689 days.

(21) Appl. No.: 17/436,985

(22) PCT Filed: Jan. 7, 2020

(86) PCT No.: PCT/JP2020/000118
§ 371 (c)(1),
(2) Date: Sep. 7, 2021

(87) PCT Pub. No.: WO2020/194981
PCT Pub. Date: Oct. 1, 2020

(65) Prior Publication Data
US 2022/0181377 A1    Jun. 9, 2022

(30) Foreign Application Priority Data
Mar. 22, 2019 (JP) ................. 2019-054998

(51) Int. Cl.
*H01L 27/146* (2006.01)

(52) U.S. Cl.
CPC .. *H01L 27/14636* (2013.01); *H01L 27/14685* (2013.01)

(58) Field of Classification Search
CPC ........ H01L 27/14636; H01L 27/14685; H01L 27/14634; H01L 27/1469
(Continued)

(56) References Cited

U.S. PATENT DOCUMENTS

| 2010/0238331 A1* | 9/2010 | Umebayashi ..... H01L 27/14621 257/E31.097 |
| 2014/0145338 A1 | 5/2014 | Fujii et al. |
| 2018/0166490 A1* | 6/2018 | Wakiyama ............. H01L 24/92 |

FOREIGN PATENT DOCUMENTS

| EP | 2230691 A2 | 9/2010 |
| EP | 2717300 A1 | 4/2014 |

(Continued)

OTHER PUBLICATIONS

International Search Report and Written Opinion of PCT Application No. PCT/JP2020/000118, issued on Mar. 17, 2020, 10 pages of ISRWO.

*Primary Examiner* — Matthew E. Gordon
(74) *Attorney, Agent, or Firm* — CHIP LAW GROUP

(57) ABSTRACT

A semiconductor device includes a first substrate which is individualized and includes a first semiconductor circuit (LOG) including a first terminal, and a second substrate which includes a second semiconductor circuit (PIX) including a second terminal. The first terminal and the second terminal are joined. The second substrate includes a first insulating layer that is arranged above the second substrate, and a second insulating layer that is arranged at least partially above the first insulating layer and in which the second terminal is arranged.

20 Claims, 12 Drawing Sheets

(58) Field of Classification Search
USPC .......................................................... 257/432
See application file for complete search history.

(56) References Cited

FOREIGN PATENT DOCUMENTS

| | | | | |
|---|---|---|---|---|
| JP | 2010-245506 A | 10/2010 | | |
| JP | 2014-027359 A | 2/2014 | | |
| JP | 2014-082365 A | 5/2014 | | |
| JP | 2016171297 A | * 9/2016 | ......... | H01L 21/6835 |
| WO | 2012/161044 A1 | 11/2012 | | |
| WO | 2016/143288 A1 | 9/2016 | | |

* cited by examiner

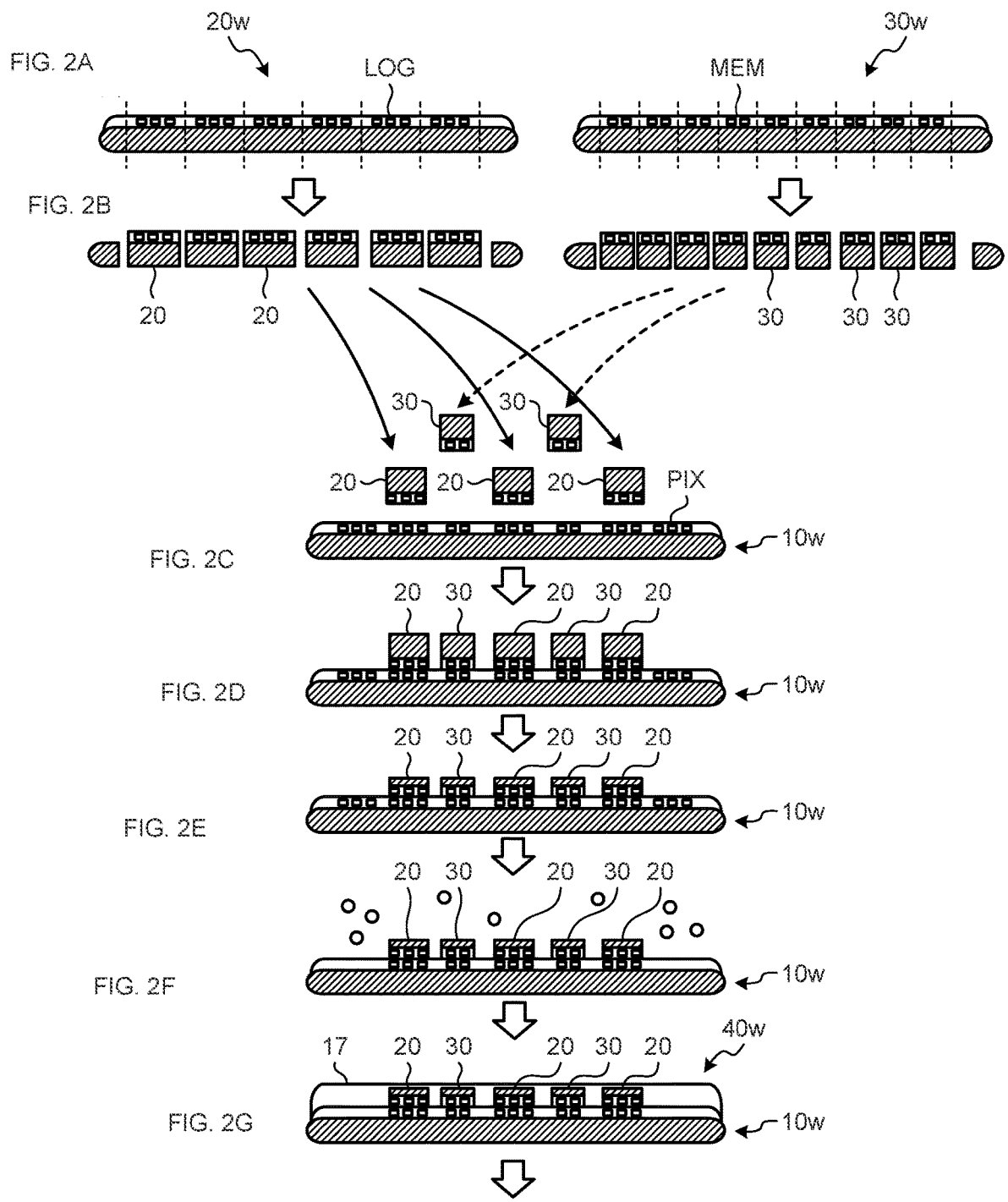

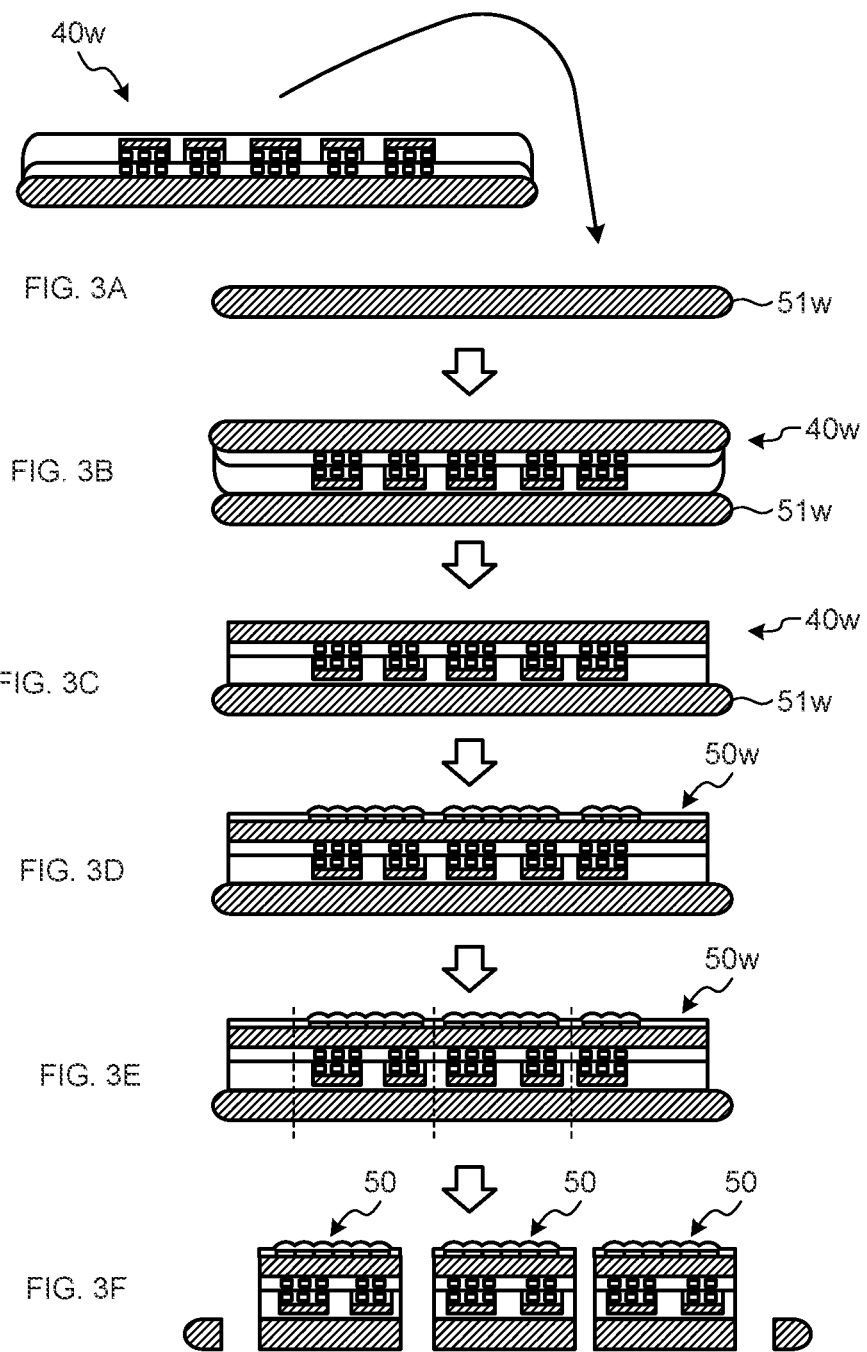

SEMICONDUCTOR DEVICE AND SOLID-STATE IMAGE SENSOR INCLUDING PIXEL SUBSTRATE JOINED WITH ANOTHER SUBSTRATE

CROSS REFERENCE TO RELATED APPLICATIONS

This application is a U.S. National Phase of International Patent Application No. PCT/JP2020/000118 filed on Jan. 7, 2020, which claims priority benefit of Japanese Patent Application No. JP 2019-054998 filed in the Japan Patent Office on Mar. 22, 2019. Each of the above-referenced applications is hereby incorporated herein by reference in its entirety.

FIELD

The present disclosure relates to a semiconductor device and a solid-state image sensor.

BACKGROUND

There is a three-dimensional mounting technology for stacking a plurality of substrates. At this time, there is a case where substrates having different areas are joined (see, for example, Patent Literature 1).

CITATION LIST

Patent Literature

Patent Literature 1: JP 2014-082365 A

SUMMARY

Technical Problem

In the structure disclosed in Patent Literature 1, a dummy terminal and the like that do not contribute to joining between substrates can be a metal contamination source.

Therefore, the present disclosure proposes a semiconductor device and a solid-state image sensor that can suppress that a dummy terminal and the like that do not contribute to joining between substrates become a metal contamination source.

Solution to Problem

According to the present disclosure, a semiconductor device is provided that includes: a first substrate configured to be individualized and include a first semiconductor circuit including a first terminal; and a second substrate configured to include a second semiconductor circuit including a second terminal, wherein the first terminal and the second terminal are joined, and the second substrate includes: a first insulating layer that is arranged above the second substrate, and a second insulating layer that is arranged at least partially above the first insulating layer and in which the second terminal is arranged.

BRIEF DESCRIPTION OF DRAWINGS

FIGS. 2A, 2B, 20, 2D, 2E, 2F, and 2G are flowcharts illustrating an example of a procedure of manufacturing processing for the solid-state image sensor according to the embodiment of the present disclosure.

FIGS. 3A, 3B, 3C, 3D, 3E, and 3F are flowcharts illustrating the example of the procedure of the manufacturing processing for the solid-state image sensor according to the embodiment of the present disclosure.

FIGS. 5A, 5B, 50, 5D, 5E, 5F, 5G, and 5H are flowcharts illustrating an example of a procedure of cleaning processing in the manufacturing processing for the solid-state image sensor according to the embodiment of the present disclosure.

DESCRIPTION OF EMBODIMENTS

Figure 1:
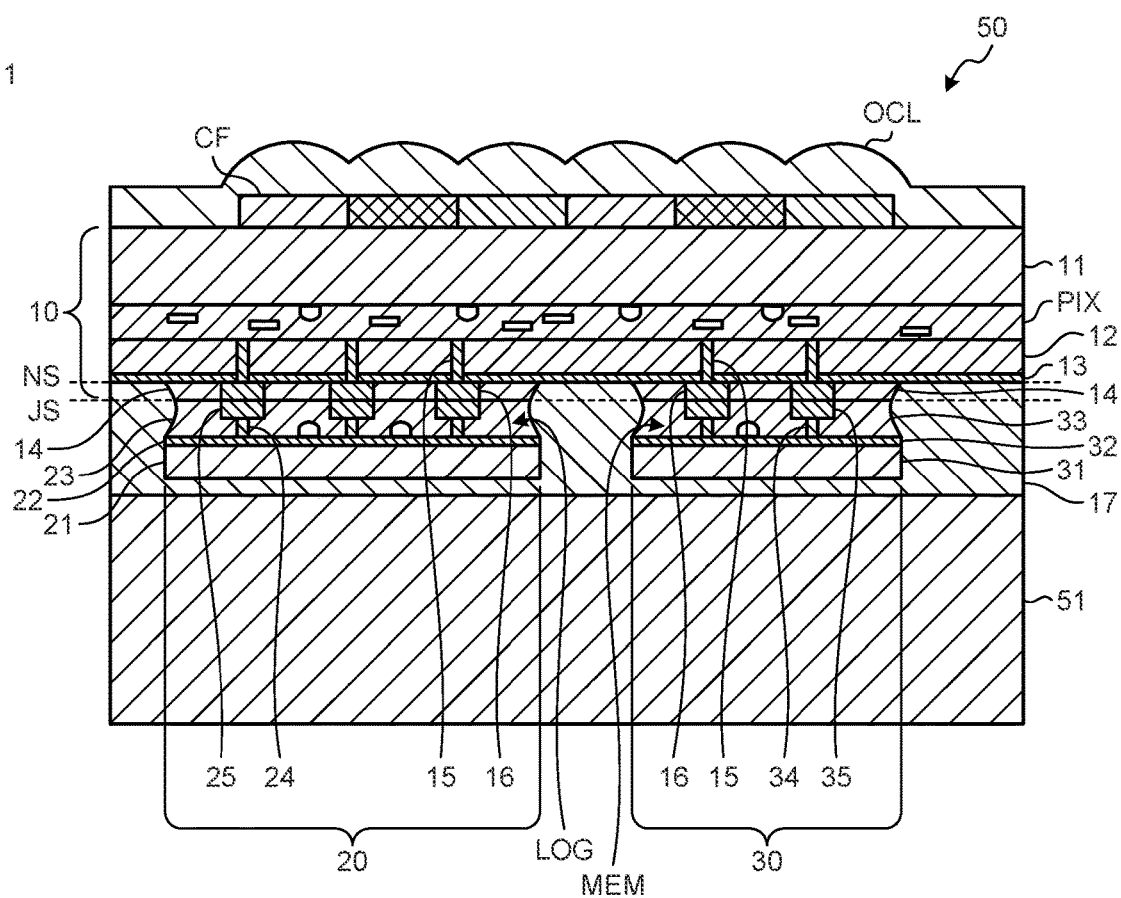
FIG. 1 is a schematic diagram illustrating a configuration example of a solid-state image sensor according to an embodiment of the present disclosure.

The embodiment of the present disclosure will be described below in detail on the basis of the drawings. Note that, in each embodiment described below, the same parts are designated by the same reference numerals, and duplicate description will be omitted.

Embodiment

The solid-state image sensor of the embodiment will be described with reference to FIGS. 1, 2A, 2B, 2C, 2D, 2E, 2F, 2G, 3A, 3B, 3C, 3D, 3E, 3F, 4A, 4B, 4C, 5A, 5B, 5C, 5D, 5E, 5F, 5G, 5H, 6A, 6B, 6C, 6D, 7, 8A, 8B, 8C, 8D. 8E, 8F, 8G, 8H, 9, 10A, 10B, 10C, 10D, 10E, 10F, 10G, 10H, 11, 12A, 12B, 12C, 12D, 12E, 12F, 12G, and 12H.

(Configuration Example of the Solid-State Image Sensor)

FIG. 1 is a schematic diagram illustrating a part of a solid-state image sensor 50 according to the embodiment of the present disclosure. As illustrated in FIG. 1, the solid-state image sensor 50, which is a semiconductor device of the embodiment, includes a logic substrate 20, which is an individualized first substrate, a memory substrate 30, which is an individualized first substrate, and a pixel substrate 10, which is an individualized second substrate.

The pixel substrate 10 includes a substrate 11 that has been individualized into a chip. For example, a photoelectric conversion element, which is not illustrated, is arranged in the substrate 11. A color filter CF and an on-chip lens OCL are arranged on one surface of the substrate 11. A pixel circuit PIX, which is a second semiconductor circuit including a pixel transistor and the like is arranged on the other surface of the substrate 11. However, the pixel circuit PIX may include a photoelectric conversion element or the like.

The on-chip lens OCL collects the emitted light, and the collected light is guided to the photoelectric conversion element via the color filter CF. The photoelectric conversion element converts the received light into an electric signal according to the amount of received light by photoelectric conversion. The pixel circuit PIX reads the electric signal from the photoelectric conversion element and outputs it to the logic substrate 20 side.

A silicon oxide ($SiO_2$) layer 12 is arranged on the pixel circuit PIX. A silicon nitride (SiN) layer 13, which is a first insulating layer, is arranged on the silicon oxide layer 12. A silicon oxide layer 14, which is a second insulating layer, is arranged on at least a part of the silicon nitride layer 13.

In the silicon oxide layer 14, a terminal 16, which is a second terminal, exposed on the surface of the silicon oxide layer 14 is arranged. In other words, the terminal 16 is arranged on the silicon nitride layer 13.

The terminal 16 is electrically connected to a pixel transistor or the like in the pixel circuit PIX by a plug 15 extending through the silicon nitride layer 13 and the silicon oxide layer 12. The terminal 16 and the plug 15 include, for example, copper (Cu). A barrier metal, which is not illustrated, is interposed as a liner between the terminal 16 and the plug 15 and the silicon oxide layers 12 and 14 and the silicon nitride layer 13. The terminal 16 and the plug 15 are also included in the pixel circuit PIX.

The logic substrate 20 includes a substrate 21 that has been individualized into a chip. A silicon nitride layer 22, which is a third insulating layer, is arranged on one surface of the substrate 21. A silicon oxide layer 23, which is a fourth insulating layer, is arranged on the silicon nitride layer 22. However, as will be described later, the silicon nitride layer 22 may not be arranged.

In the silicon oxide layer 23, a logic circuit LOG, which is a first semiconductor circuit, including, for example, a logic transistor is arranged. The logic circuit LOG processes the electric signal output from the pixel substrate 30.

Further, in the silicon oxide layer 23, a terminal 25, which is a first terminal, exposed on the surface of the silicon oxide layer 23 is arranged. The terminal 25 is electrically connected to the logic transistor or the like in the logic circuit LOG by a plug 24 extending through the silicon oxide layer 23. The terminal 25 and the plug 24 include, for example, copper. A barrier metal, which is not illustrated, is interposed as a liner between the terminal 25 and the plug 24 and the silicon oxide layer 23 and the silicon nitride layer 22. The terminal 25 and the plug 24 are also included in the logic circuit LOG.

The memory substrate 30 includes a substrate 31 that has been individualized into a chip. A silicon nitride layer 32, which is a third insulating layer, is arranged on one surface of the substrate 31. A silicon oxide layer 33, which is a fourth insulating layer, is arranged on the silicon nitride layer 32. However, as will be described later, the silicon nitride layer 32 may not be arranged.

In the silicon oxide layer 33, a memory circuit MEM, which is a first semiconductor circuit, including, for example, a memory transistor is arranged. The memory circuit MEM holds various data necessary for the function of a solid-state image sensor 1.

Further, in the silicon oxide layer 33, a terminal 35, which is a first terminal, exposed on the surface of the silicon oxide layer 33 is arranged. The terminal 35 is electrically connected to the memory transistor or the like in the memory circuit MEM by a plug 34 extending through the silicon oxide layer 33. The terminal 35 and the plug 34 include, for example, copper. A barrier metal, which is not illustrated, is interposed as a liner between the terminal 35 and the plug 34 and the silicon oxide layer 33 and the silicon nitride layer 32. The terminal 35 and the plug 34 are also included in the memory circuit MEM.

The pixel substrate 10 and the logic substrate 20 are joined by the terminal 16 included in the pixel substrate 10 and the terminal 25 included in the logic substrate 20. The joining of the terminals 16 and 25 is a so-called Cu—Cu joint.

The pixel substrate 10 and the memory substrate 30 are joined by the terminal 16 included in the pixel substrate 10 and the terminal 35 included in the memory substrate 30. The joining of the terminals 16 and 35 is a so-called Cu—Cu joint.

The surface of the pixel substrate 10 on the logic substrate 20 and memory substrate 30 side includes a joining surface JS and a non-joining surface NS. The non-joining surface NS is arranged on the substrate 11 side with respect to the joining surface JS. In the pixel substrate 10, the surface of the silicon oxide layer 14 including the terminal 16 is the joining surface JS. Further, in a region where the silicon oxide layer 14 is not partially arranged on the silicon nitride layer 13 or the like, at least the surface of the silicon nitride layer 13 is the non-joining surface NS.

End faces of the silicon oxide layers 14, 23, and 33 facing the silicon nitride layer 13, which is the non-joining surface NS, have a recess shape curved into the inside of each layer 14, 23, and 33.

The surface of the logic substrate 20 on the pixel substrate 10 side includes only the joining surface JS. That is, in the logic substrate 20, the entire surface of the silicon oxide layer 23 including the terminal 25 is the joining surface JS.

The surface of the memory substrate 30 on the pixel substrate 10 side includes only the joining surface JS. That is, in the memory substrate 30, the entire surface of the silicon oxide layer 33 including the terminal 35 is the joining surface JS.

On the pixel substrate 10, the logic substrate 20, and the memory substrate 30, an insulating layer 17 that covers the entire logic substrate 20, the entire memory substrate 30, and the non-joining surface NS of the pixel substrate 10 is arranged. The insulating layer 17 is, for example, a resin layer including polyimide or the like, or an inorganic layer including silicon oxide or the like.

An individualized support substrate 51 is arranged on the surface side of the logic substrate 20 and the memory substrate 30 opposite to each circuit LOG and MEM. The support substrate 51 is joined to the pixel substrate 10, the logic substrate 20, and the memory substrate 30 via the insulating layer 17.

(Outline of Manufacturing Processing for the Solid-State Image Sensor)

Next, the outline of the manufacturing processing for the solid-state image sensor 50 of the embodiment will be described in conjunction with FIGS. 2A, 2B, 2C, 2D, 2E 2F, 2G, 3A, 3B, 3C, 3D, 3E and 3F. FIGS. 2A, 2B, 20, 2D, 2E, 2F, 2G, 3A, 3B, 3C, 3D. 3E and 3E are flowcharts illustrating an example of the procedure of the manufacturing processing for the solid-state image sensor 50 according to the embodiment of the present disclosure.

As illustrated in FIG. 2A, a pre-individualization logic substrate 20w in which the logic circuit LOG is formed and a pre-individualization memory substrate 30w in which the memory circuit MEM is formed are prepared.

As illustrated in FIG. 2B, the logic substrate 20w and the memory substrate 30w are individualized to obtain the logic substrate 20 and the memory substrate 30, respectively. That is, the logic substrate 20w and the memory substrate 30w are diced with a dicing saw, a laser, or the like to respectively provide the logic substrate 20 and the memory substrate 30 having a chip shape.

As illustrated in FIG. 2C, a pre-individualization pixel substrate 10w in which the pixel circuit PIX is formed is prepared.

As illustrated in FIG. 2D, the logic substrate 20, the memory substrate 30, and the pixel substrate 10w are joined by the terminals 16, 25, and 35.

As illustrated in FIG. 2E, the back surfaces of the logic substrate 20 and the memory substrate 30 are ground and thinned.

As illustrated in FIG. 2E, the grinding dust of the logic substrate 20 and the memory substrate 30 is cleaned.

As illustrated in FIG. 2G, the insulating layer 17 that covers the logic substrate 20, the memory substrate 30, and the non-joining surface NS of the pixel substrate 10w is formed to obtain a joint substrate 40w including the logic substrate 20, the memory substrate 30, and the pixel substrate 10w.

As illustrated in FIG. 3A, a pre-individualization support substrate 51w is prepared.

As illustrated in FIG. 3B, the support substrate 51w and the joint substrate 40w are joined via the insulating layer 17.

As illustrated in FIG. 3C, the joint substrate 40w is thinned and cleaned from the pixel substrate 10w side.

As illustrated in FIG. 3D, the color filter CF, the on-chip lens OCL, and the like are formed on the pixel substrate 10w to obtain a pre-individualization solid-state image sensor 50w.

As illustrated in FIG. 3E, the solid-state image sensor 50w is individualized. That is, the solid-state image sensor 50w is diced with a dicing saw, a laser, or the like to provide the solid-state image sensor 50 having a chip shape.

As illustrated in FIG. 3F, the individualized solid-state image sensor 50 is obtained.

Thus, the manufacturing processing for the solid-state image sensor 50 of the embodiment is completed.

(Example of Cleaning Processing for the Solid-State Image Sensor)

Figures 4A, 4B:
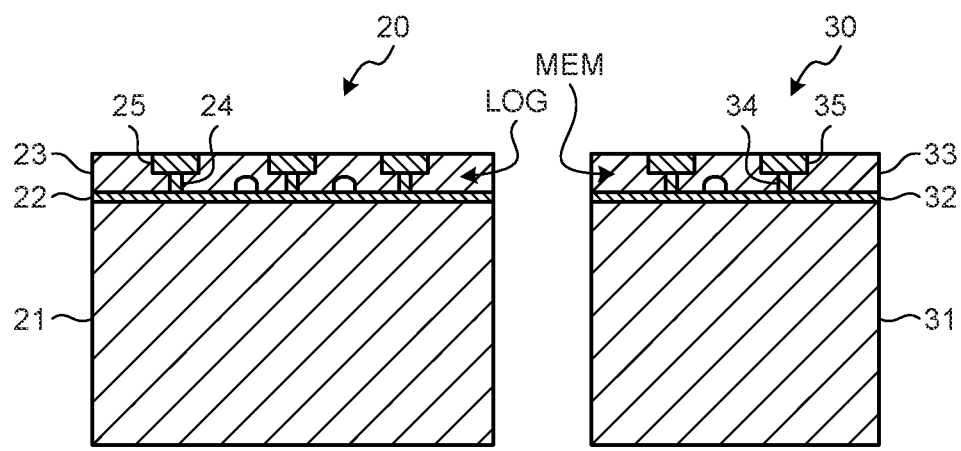
FIGS. 4A, 4B, and 4C are schematic diagrams illustrating a configuration of each substrate before joining in the manufacturing processing for the solid-state image sensor according to the embodiment of the present disclosure.
Figure 4C:
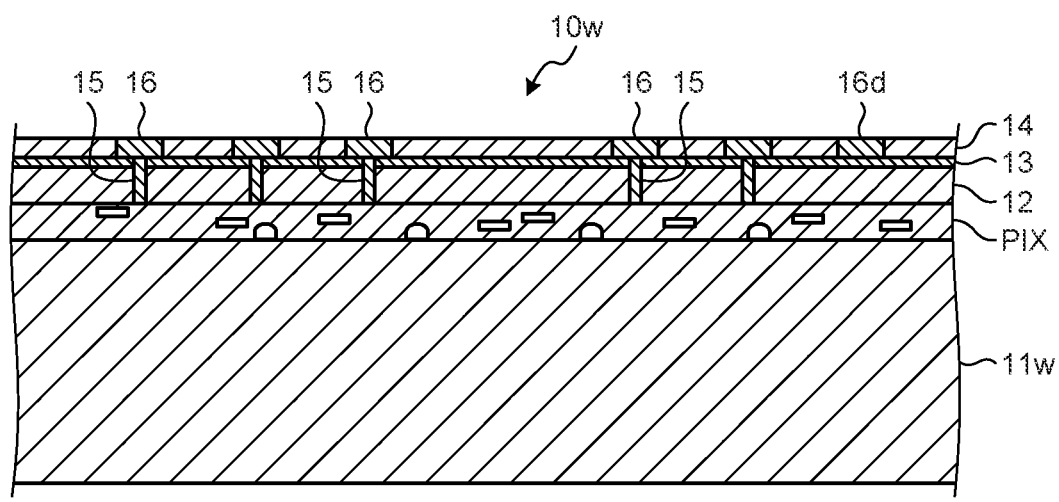

Next, an example of the cleaning processing in the manufacturing processing for the solid-state image sensor 50 of the embodiment will be described in conjunction with FIGS. 4A, 4B, 4C, 5A, 5B, 50, 5D, 5E, 5F, 5G, and 5H. FIGS. 4A, 4B, and 4C are schematic diagrams illustrating a configuration of each substrate 10w, 20, and 30 before joining in the manufacturing processing for the solid-state image sensor 50 according to the embodiment of the present disclosure.

As illustrated in FIG. 4A, the individualized end faces of the logic substrate 20 before joining have a straight shape. In the logic substrate 20 after the manufacturing processing for the solid-state image sensor 50, the end faces of the silicon oxide layer 23 have a recess shape curved into the inside of the silicon oxide layer 23 due to the cleaning processing described later.

As illustrated in FIG. 4B, the individualized end faces of the memory substrate 30 before joining have a straight shape. In the memory substrate 30 after the manufacturing processing for the solid-state image sensor 50, the end faces of the silicon oxide layer 33 have a recess shape curved into the inside of the silicon oxide layer 33 due to the cleaning processing described later.

As illustrated in FIG. 4C, in the pixel substrate 10w before joining, the silicon oxide layer 14 is arranged on the entire surface of the silicon nitride layer 13. In the pixel substrate 10 after the manufacturing processing for the solid-state image sensor 50, the silicon oxide layer 14 is partially missing due to the cleaning processing described later.

Further, in the pixel substrate 10w before joining, a terminal 16d, which is a third terminal, exposed on the surface of the silicon oxide layer 14 may be arranged in the silicon oxide layer 14. In other words, the terminal 16d is arranged on the silicon nitride layer 13.

The terminal 16d does not have the plug 15 or the like, and is not electrically connected to the pixel transistor or the like in the pixel circuit PIX. That is, the terminal 16d is a dummy terminal that is not included in the pixel circuit PIX. The terminal 16d is provided so that pattern dependence or the like does not occur in, for example, processing when forming another terminal 16.

Such terminal 16d may be arranged at a position displaced from the joining surface JS between the logic substrate 20 and the memory substrate 30 and the pixel substrate 10w. In this case, after the logic substrate 20 and the memory substrate 30 are joined to the pixel substrate 10w, the terminal 16d is in a state of being exposed on the surface of the silicon oxide layer 14. The pixel substrate 10w to which the logic substrate 20 and the memory substrate 30 are joined is subjected to the grinding processing and the cleaning processing of the logic substrate 20 and the memory substrate 30 in such a state.

FIGS. 5A, 5B, 50, 5D, 5E, 5F, 5G, and 5H are flowcharts illustrating an example of the procedure of the cleaning processing in the manufacturing processing for the solid-state image sensor 50 according to the embodiment of the present disclosure. FIGS. 5A, 5B, 50, 5D, 5E, 5F, and 5G illustrate a region that is displaced from the joining surface JS between the logic substrate 20 and the pixel substrate 10w and where the terminal 16d exposed on the surface of the silicon oxide layer 14 does not exist. FIGS. 5B, 50, 5D, 5E, 5E, 5F, 5G and 5H illustrate a region that is displaced from the joining surface JS between the logic substrate 20 and the pixel substrate 10w and where the terminal 16d exposed on the surface of the silicon oxide layer 14 exists.

First, the cleaning processing for the region where the exposed terminal 16d does not exist will be described.

Figure 5A:
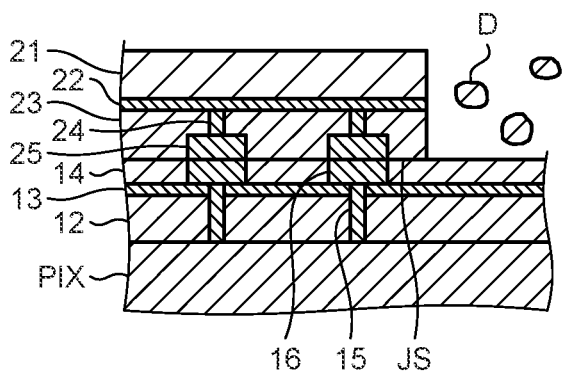

As illustrated in FIG. 5A, for example, after grinding the logic substrate 20, grinding dust D such as of silicon exists around the logic substrate 20 and the pixel substrate 10w.

Figure 5B:
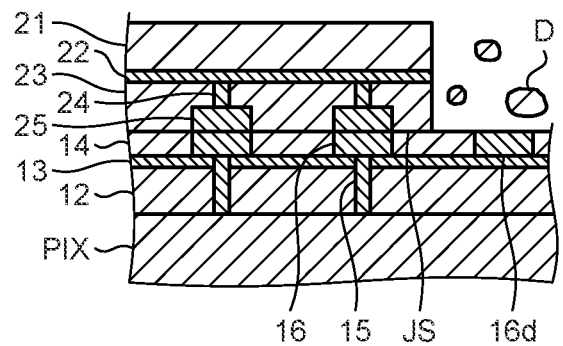
Figure 5C:
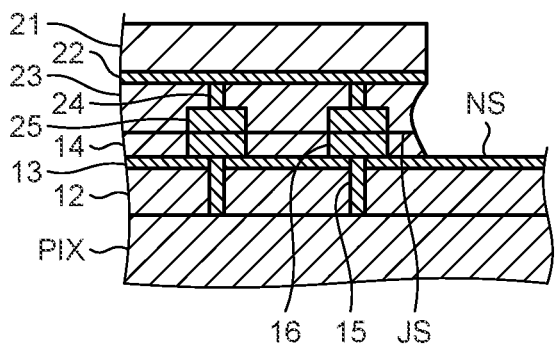

As illustrated in FIG. 5C, in order to remove the grinding dust D, the cleaning processing is performed using a cleaning solution such as an aqueous solution of hydrofluoric acid-hydrogen peroxide (FPM).

At this time, in the region displaced from the joining surface JS between the logic substrate 20 and the pixel substrate 10w, the exposed surface of the silicon oxide layer 14 is exposed to the cleaning solution.

Thus, the silicon oxide layer 14 is dissolved. For example, at least one of the cleaning time, the cleaning temperature, the concentration of the cleaning solution, and the like is adjusted, and the cleaning processing is continued until the silicon oxide layer 14 is completely removed in a layer thickness direction. Here, the dissolution rate of the silicon nitride layer 13 by the cleaning solution is lower than the dissolution rate of the silicon oxide layer 14 by the cleaning solution. That is, the silicon nitride layer 13 is superior in resistance to the cleaning solution as compared with the silicon oxide layer 14. Therefore, the silicon nitride layer 13 functions as a stopper layer and suppresses erosion of the pixel circuit PIX or the like, which is a layer underlying the silicon nitride layer 13.

Further, at this time, the end face of the individualized logic substrate 20 is also exposed to the cleaning solution.

Thus, the end face of the silicon oxide layer 23 is dissolved and isotropically eroded into the inside of the silicon oxide layer 23 to have a recess shape. Thus, at the portion corresponding to the hem of the end face of the silicon oxide layer 23, the silicon oxide layer 14 is also isotropically eroded into the inside of the silicon oxide layer 14 to have a recess shape.

After the cleaning processing is completed, the non-joining surface NS including the surface of the silicon nitride layer 13 exposed by erosion of the silicon oxide layer 14 is formed. The non-joining surface NS is arranged on the substrate 11 side with respect to the joining surface JS because of the erosion by the cleaning solution or the like.

Figure 5D:
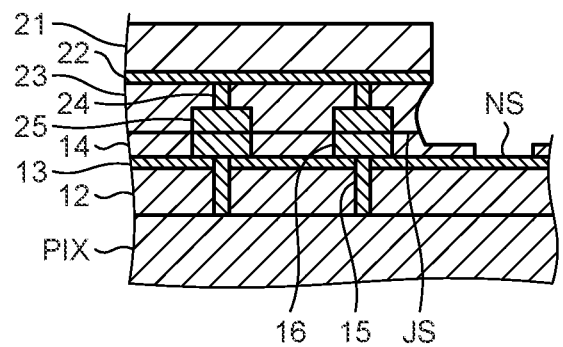
Figure 5E:
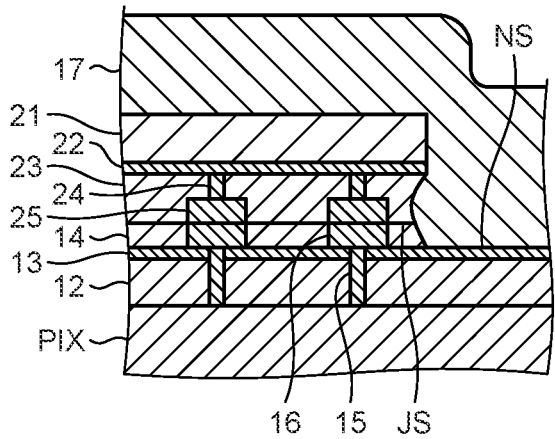
Figure 5F:
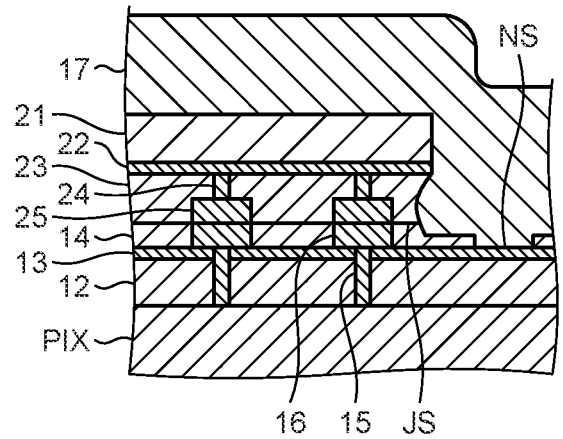

As illustrated in FIG. 5E, the insulating layer 17 that covers the entire logic substrate 20 and the non-joining surface NS of the pixel substrate 10w is formed. At this stage, the insulating layer 17 has a step corresponding to the thickness of the logic substrate 20 and the difference in height between the joining surface JS and the non-joining surface NS.

Figure 5G:
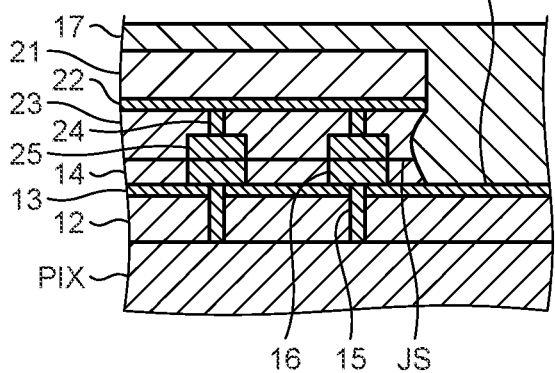

As illustrated in FIG. 5G, the insulating layer 17 is planarized.

Next, the cleaning processing for the region where the exposed terminal 16d exists will be described.

As illustrated in FIG. 5B, for example, after grinding the logic substrate 20, grinding dust D such as of silicon exists around the logic substrate 20 and the pixel substrate 10w.

As illustrated in FIG. 5D, in order to remove the grinding dust D, the cleaning processing is performed using a cleaning solution such as FPM.

At this time, in the region displaced from the joining surface JS between the logic substrate 20 and the pixel substrate 10w, both the exposed surface of the silicon oxide layer 14 and the exposed surface of the terminal 16d are exposed to the cleaning solution.

Thus, the silicon oxide layer 14 and the terminal 16d are dissolved. For example, in the region where the above-described exposed terminal 16d does not exist, the cleaning processing is continued until the silicon nitride layer 13 is completely removed in the layer thickness direction. Therefore, in the region where the exposed terminal 16d exists, the terminal 16d is completely dissolved, or the silicon oxide layer 14, which is the base of the terminal 16d, is eroded and the terminal 16d is separated from the silicon oxide layer 14.

Note that the erosion of the silicon oxide layer 14 in the region where the exposed terminal 16d exists proceeds more slowly than the erosion of the silicon oxide layer 14 in the aforementioned region where the exposed terminal 16d does not exist. Therefore, the silicon oxide layer 14 is not completely removed in the layer thickness direction, but remains slightly.

Further, at this time, the end face of the individualized logic substrate 20 is also exposed to the cleaning solution.

Thus, the end face of the silicon oxide layer 23 is dissolved and isotropically eroded into the inside of the silicon oxide layer 23 to have a recess shape. Thus, at the portion corresponding to the hem of the end face of the silicon oxide layer 23, the silicon oxide layer 14 is also isotropically eroded into the inside of the silicon oxide layer 14 to have a recess shape.

After the cleaning processing is completed, the terminal 16d disappears from the silicon oxide layer 14. Then, the non-joining surface NS including the surface of the silicon oxide layer 14 newly exposed as a result of erosion by the cleaning solution and, for example, the surface of the silicon nitride layer 13 exposed as a result of the disappearance of the terminal 16d is formed. As described above, the non-joining surface NS may include the surface of the eroded silicon oxide layer 14 in a part of the region.

As illustrated in FIG. 5E, the insulating layer 17 that covers the entire logic substrate 20 and the non-joining surface NS of the pixel substrate 10w is formed.

Figure 5H:
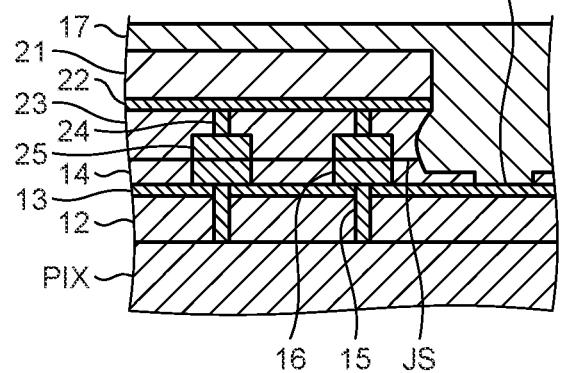

As illustrated in FIG. 5H, the insulating layer 17 is planarized

Thus, the cleaning processing in the manufacturing processing for the solid-state image sensor 50 is completed.

Note that there is a case where, after the processing of FIGS. 5C and D and before the processing of FIGS. 5E and E, processing of further thinning and substantially completely removing the thinned substrate 21 of the logic substrate 20 and the thinned substrate 31 of the memory substrate 30 by chemical mechanical polishing (CMP), etching, or the like is performed.

The silicon nitride layer 22 of the logic substrate 20 and the silicon nitride layer 32 of the memory substrate 30 function as a stopper layer at this time. The silicon nitride layers 22 and 32 may not be arranged unless the substrates 21 and 31 are further thinned.

COMPARATIVE EXAMPLE

Next, a problem of a solid-state image sensor of a comparative example will be described in conjunction with FIGS. 6A, 6B, 6C, and 6D. The solid-state image sensor of the comparative example does not include the silicon nitride layer 13 that functions as a stopper layer.

Figure 6A:
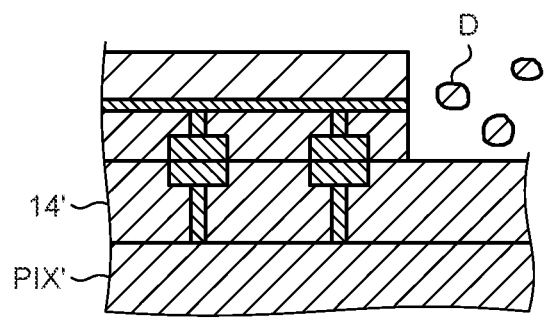
FIGS. 6A, 6B, 6C and 6D are flowcharts illustrating an example of a procedure of cleaning processing in manufacturing processing for a solid-state image sensor according to a comparative example of the present disclosure.
Figure 6B:
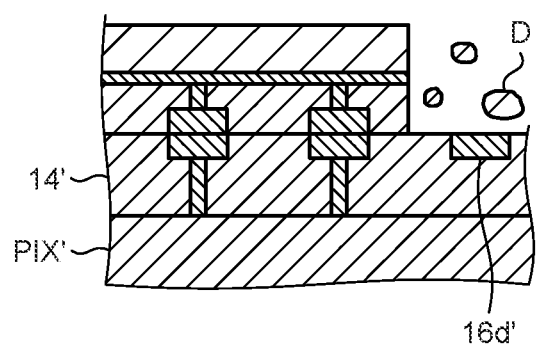
Figure 6C:
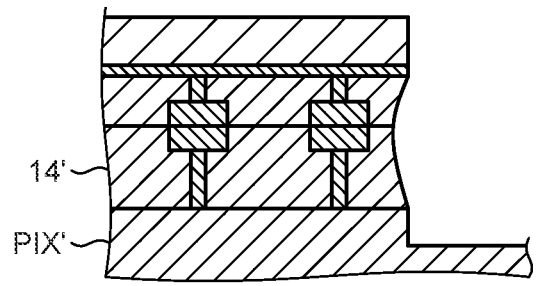

FIGS. 6A and 6C are examples in which strict conditions are used as in the above-described embodiment.

As illustrated in FIG. 6A, it is assumed that the grinding dust D is removed in the region where an exposed dummy terminal 16d' does not exist under the strict conditions as in the above-described embodiment. However, under such conditions, as illustrated in FIG. 6C, there is a possibility that a silicon oxide layer 14' is completely removed in the layer thickness direction and, for example, a pixel circuit PIX' is eroded and damaged.

FIGS. 6B and (Bb)6D are examples in which conditions laxer than those of the above-described embodiment are used.

Figure 6D:
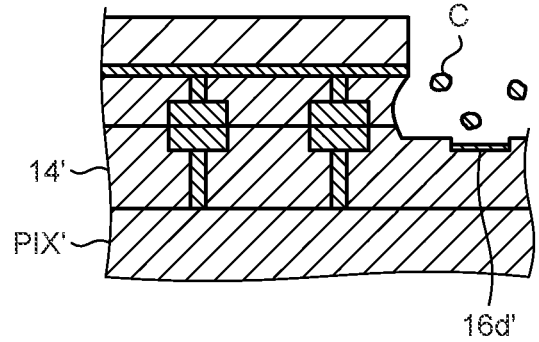

As illustrated in FIG. 6B, it is assumed that the grinding dust D is removed in the region where the exposed dummy terminal 16d' exists under the conditions laxer than those of the above-described embodiment. However, under such conditions, as illustrated in FIG. 6D, there is a case where, for example, a part of the terminal 16d' does not disappear, and remains in the silicon oxide layer 14'. In this case, there is a possibility that the terminal 16d' becomes a metal contamination source.

The solid-state image sensor 50 of the embodiment includes the silicon nitride layer 13 that is arranged above the pixel substrate 10w and the silicon oxide layer 14 that is arranged above the silicon nitride layer 13 and in which the terminal 16d is arranged. By including the silicon nitride layer 13 under the terminal 16d arranged in the silicon oxide layer 14 in this way, the silicon nitride layer 13 can function as a stopper layer in the cleaning processing after grinding of the logic substrate 20 and the like, and it is possible to suppress damage to the pixel circuit PIX. Therefore, the exposed terminal 16d can be caused to disappear by using strict conditions, and it is possible to prevent the residue of the terminal 16d from becoming a metal contamination source.

First Variation Example

In the manufacturing processing for the solid-state image sensor, the silicon nitride layer can be inserted not only directly under the terminal but also in a different part.

A solid-state image sensor 50a of a first variation example of the embodiment will be described in conjunction with FIGS. 7, 8A, 8B, 8C, 8D, 8E, 8F, 8G and 8H. In the solid-state image sensor 50a of the first variation example, the insertion position of a silicon nitride layer 13u, which is a first insulating layer, is different from that in the above-described embodiment.

Figure 7:
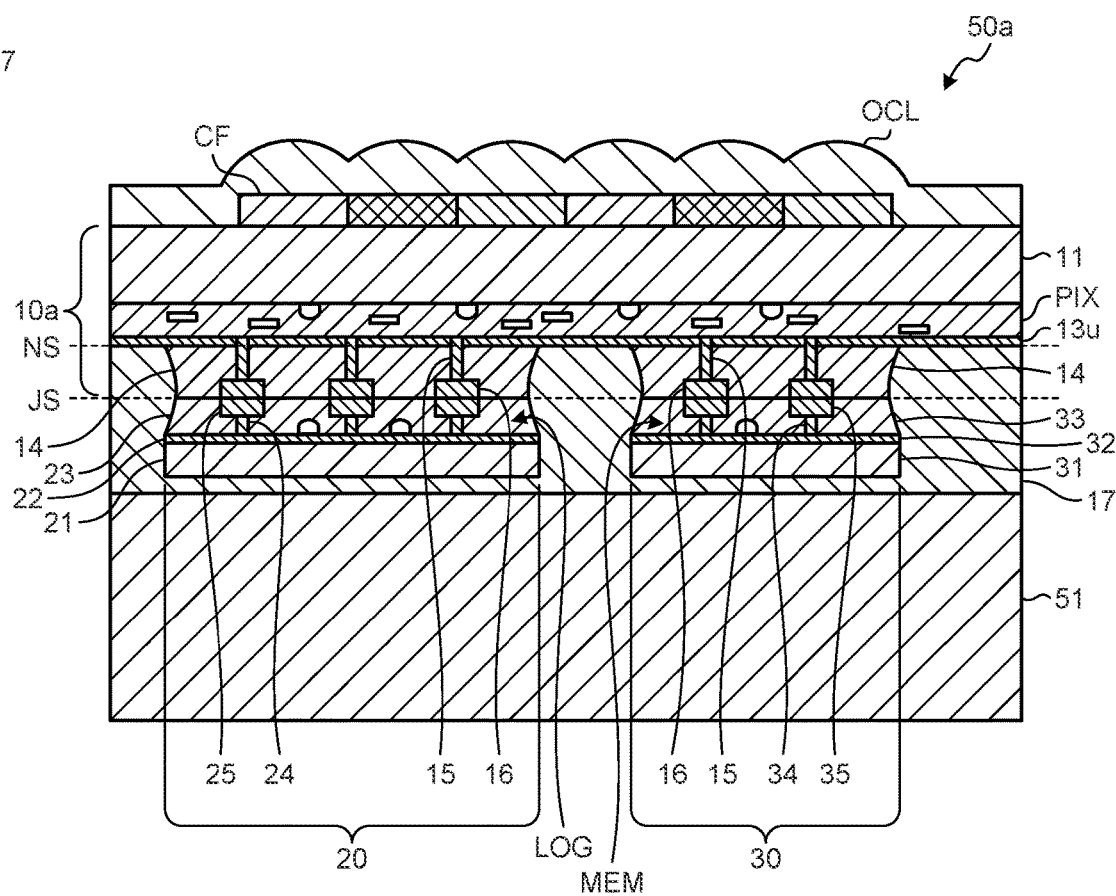
FIG. 7 is a schematic diagram illustrating a configuration example of a solid-state image sensor according to a first variation example of the embodiment of the present disclosure.

FIG. 7 is a schematic diagram illustrating a configuration example of the solid-state image sensor 50a according to the first variation example of the embodiment. As illustrated in FIG. 7, in a pixel substrate 10a, for example, the silicon nitride layer 13u is arranged on the pixel circuit PIX without the silicon oxide layer 12, and the silicon oxide layer 14 is arranged on at least a part of the silicon nitride layer 13u.

The silicon nitride layer 13u is formed to have, for example, the same thickness as the silicon nitride layer 13 of the above-described embodiment. The silicon oxide layer 14 is formed to have a thickness of, for example, the sum of the silicon oxide layers 12 and 14 of the above-described embodiment.

In the silicon oxide layer 14, the terminal 16 exposed on the surface of the silicon oxide layer 14 is arranged. The terminal 16 is electrically connected to the pixel transistor or the like in the pixel circuit PIX by the plug 15 extending through the silicon oxide layer 14 and the silicon nitride layer 13.

That is, in the pixel substrate 10a of the first variation example, the silicon nitride layer 13u is arranged not directly under the terminal 16, but at a leg of the plug 15.

In the pixel substrate 10a, the surface of the silicon oxide layer 14 including the terminal 16 is the joining surface JS. Further, in a region where the silicon oxide layer 14 is not partially arranged on the silicon nitride layer 13u or the like, at least the surface of the silicon nitride layer 13u is the non-joining surface NS.

End faces of the silicon oxide layers 14, 23, and 33 facing the silicon nitride layer 13, which is the non-joining surface NS, have a recess shape curved into the inside of each layer 14, 23, and 33.

FIGS. 8A, 8B, 8C, 8D, 8E, 8F, 8G and 8H are flowcharts illustrating an example of the procedure of the cleaning processing in the manufacturing processing for the solid-state image sensor 50a according to the first variation example of the embodiment of the present disclosure.

First, the cleaning processing for the region where the exposed terminal 16d does not exist will be described.

Figure 8A:
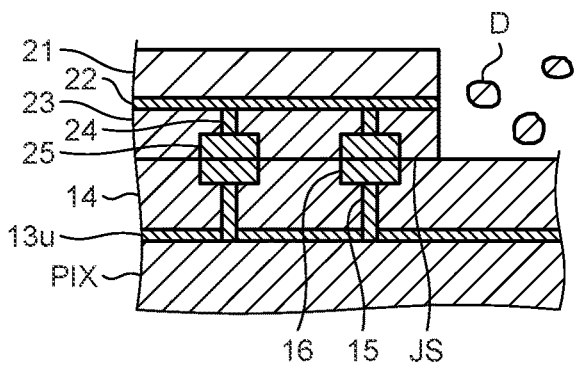
FIGS. 8A, 8B, 8C, 8D, 8E, 8F, 8G, and 8H are flowcharts illustrating an example of a procedure of cleaning processing in manufacturing processing for the solid-state image sensor according to the first variation example of the embodiment of the present disclosure.

As illustrated in FIG. 8A, for example, after grinding the logic substrate 20, the grinding dust D such as of silicon exists around the logic substrate 20 and the pre-individualization pixel substrate.

Figure 8B:
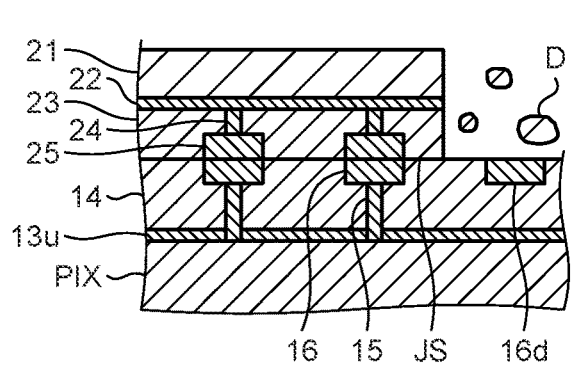
Figure 8C:
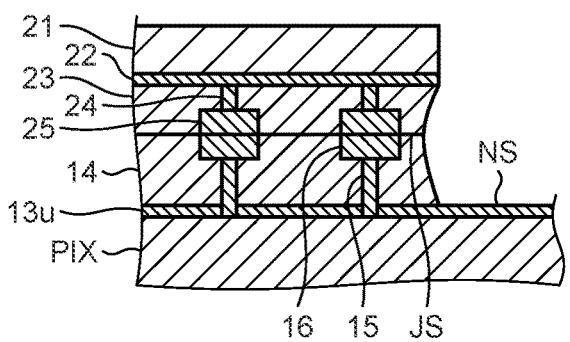

As illustrated in FIG. 8C, in order to remove the grinding dust D, the cleaning processing is performed using a cleaning solution such as FPM.

At this time, for example, at least one of the cleaning time, the cleaning temperature, the concentration of the cleaning solution, and the like is adjusted, and the cleaning processing is continued until the silicon oxide layer 14 is completely removed in a layer thickness direction. The silicon nitride layer 13u functions as a stopper layer and suppresses erosion of the pixel circuit PIX or the like, which is a layer underlying the silicon nitride layer 13u.

After the cleaning processing is completed, the non-joining surface NS including the surface of the silicon nitride layer 13u exposed by erosion of the silicon oxide layer 14 is formed.

Figure 8D:
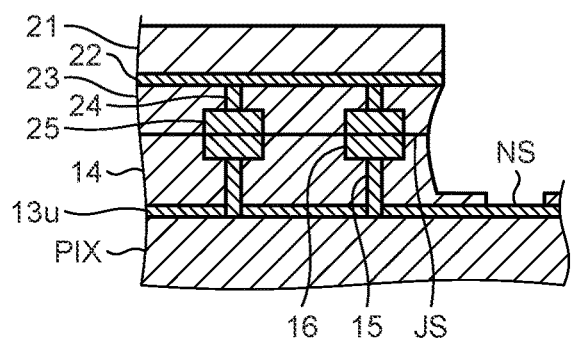
Figure 8E:
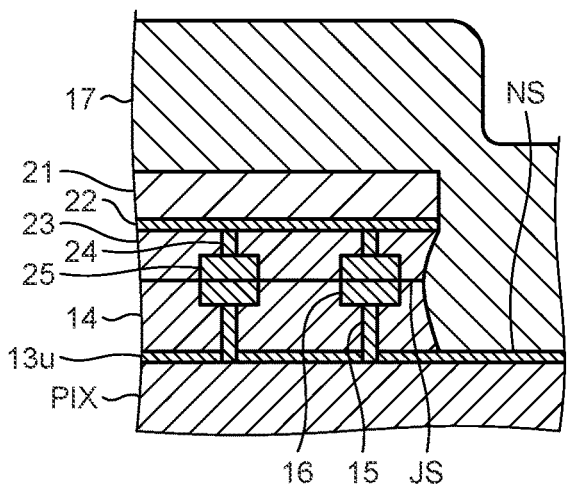
Figure 8F:
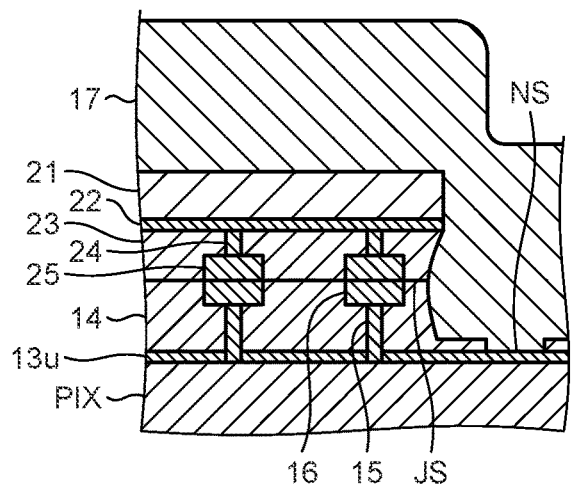

As illustrated in FIG. 8E, the insulating layer 17 that covers the entire logic substrate 20 and the non-joining surface NS of the pixel substrate is formed. Here, since the silicon nitride layer 13u is closer to a substrate 11w than that in the example of the above-described embodiment and the silicon oxide layer 14 is formed thicker than that in the example of the above-described embodiment, the difference in height between the joining surface JS and the non-joining surface NS is further increased. Therefore, the step of the insulating layer 17 at this stage is larger than that in the example of the above-described embodiment.

Figure 8G:
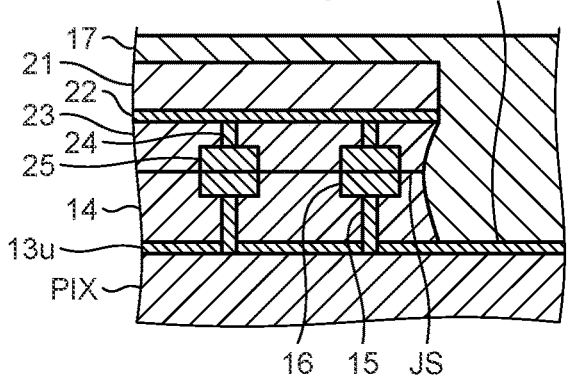

As illustrated in FIG. 8G, the insulating layer 17 is planarized.

Next, the cleaning processing for the region where the exposed terminal 16d exists will be described.

As illustrated in FIG. 8B, for example, after grinding the logic substrate 20, the grinding dust D such as of silicon exists around the logic substrate 20 and the pre-individualization pixel substrate.

As illustrated in FIG. 8D, in order to remove the grinding dust D, the cleaning processing is performed using a cleaning solution such as FPM. The terminal 16d is completely dissolved, or the silicon oxide layer 14, which is the base of the terminal 16d, is eroded and the terminal 16d is separated from the silicon oxide layer 14.

After the cleaning processing is completed, the terminal 16d disappears from the silicon oxide layer 14. Then, the non-joining surface NS including the surface of the silicon oxide layer 14 newly exposed as a result of erosion by the cleaning solution and the surface of the silicon nitride layer 13u exposed as a result of the removal of the silicon oxide layer 14 is formed. As described above, the non-joining surface NS may include the surface of the eroded silicon oxide layer 14 in a part of the region.

As illustrated in FIG. 8E, the insulating layer 17 that covers the entire logic substrate 20 and the non-joining surface NS of the pixel substrate is formed.

Figure 8H:
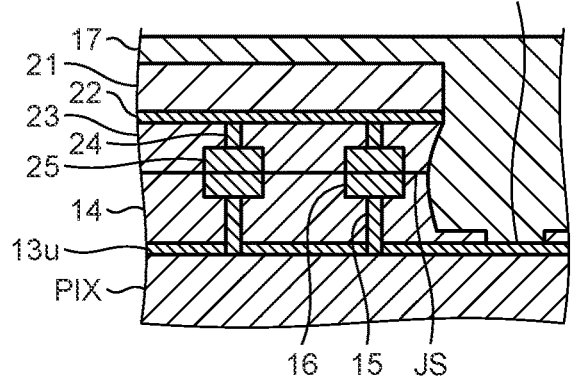

As illustrated in FIG. 8H, the insulating layer 17 is planarized

Thus, the cleaning processing in the manufacturing processing for the solid-state image sensor 50a is completed.

As described above, the solid-state image sensor 50a of the first variation example also has the same effect as that of the above-described embodiment.

Second Variation Example

Next, a solid-state image sensor 50b of a second variation example of the embodiment will be described in conjunction with FIGS. 9, 10A, 10B, 10C, 10D, 10E, 10F, 10G, and 10H. The solid-state image sensor 50b of the second variation example is different from the above-described first variation example in that the silicon oxide layer 14 is not completely removed.

Figure 9:
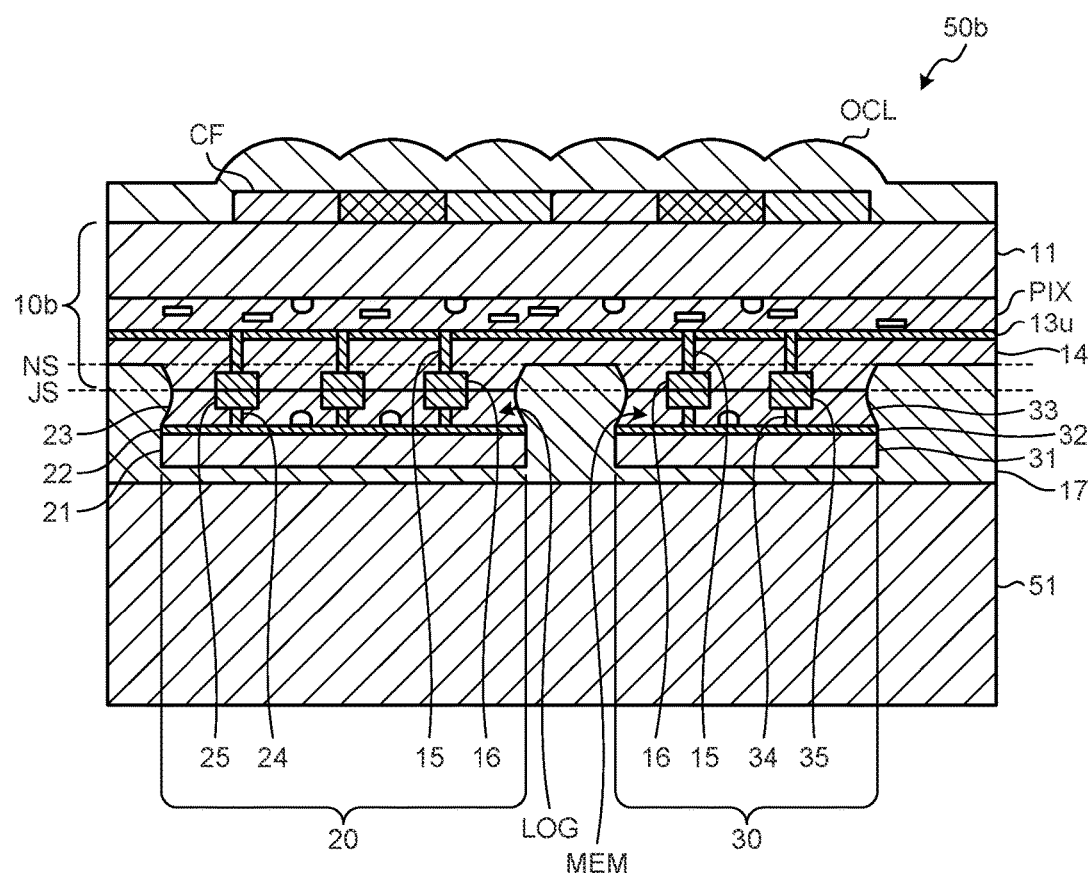
FIG. 9 is a schematic diagram illustrating a configuration example of a solid-state image sensor according to a second variation example of the embodiment of the present disclosure.

FIG. 9 is a schematic diagram illustrating a configuration example of the solid-state image sensor 50b according to the second variation example of the embodiment. As illustrated in FIG. 9, in a pixel substrate 10b of the second variation example, the silicon nitride layer 13u is also arranged at a leg of the plug 15.

In the pixel substrate 10b, the surface of the silicon oxide layer 14 including the terminal 16 has a step. Among the surfaces of the silicon oxide layer 14, the surface that is far from the substrate 11 side and joined to the logic substrate 20 and the memory substrate 30 is the joining surface JS. Among the surfaces of the silicon oxide layer 14, the surface that is on the substrate 11 side with respect to the surface of the silicon oxide layer 14 constituting the joining surface JS and not joined to the logic substrate 20 or the memory substrate 30 is the non-joining surface NS.

End faces of the silicon oxide layers 14, 23, and 33 facing the silicon oxide layer 14, which is the non-joining surface NS, have a recess shape curved into the inside of each layer 14, 23, and 33.

FIGS. 10A, 10B, 10C, 10D, 10E, 10F, 10G, and 10H are flowcharts illustrating an example of the procedure of the cleaning processing in the manufacturing processing for the solid-state image sensor 50b according to the second variation example of the embodiment of the present disclosure.

First, the cleaning processing for the region where the exposed terminal 16d does not exist will be described.

Figure 10A:
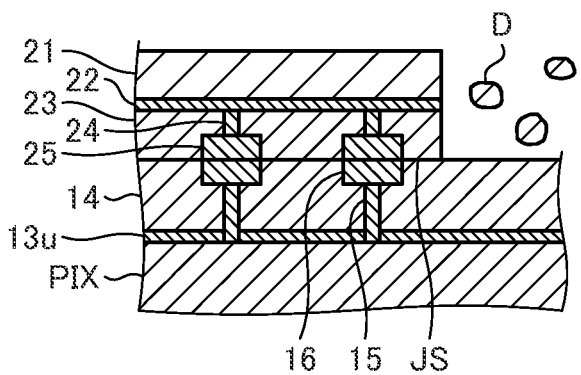
FIGS. 10A, 10B, 10C, 10D, 10E, 10F, 10G, and 10H are flowcharts illustrating an example of a procedure of cleaning processing in manufacturing processing for the solid-state image sensor according to the second variation example of the embodiment of the present disclosure.

As illustrated in FIG. 10A, for example, after grinding the logic substrate 20, the grinding dust D such as of silicon exists around the logic substrate 20 and the pre-individualization pixel substrate.

Figure 10B:
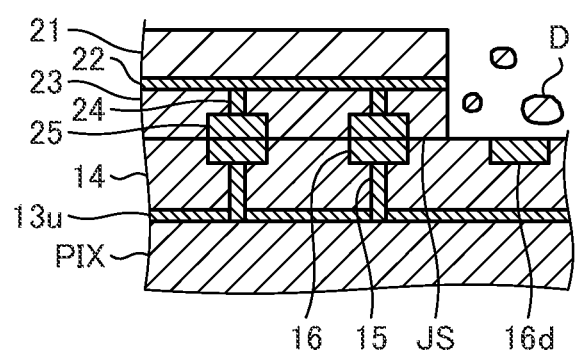
Figure 10C:
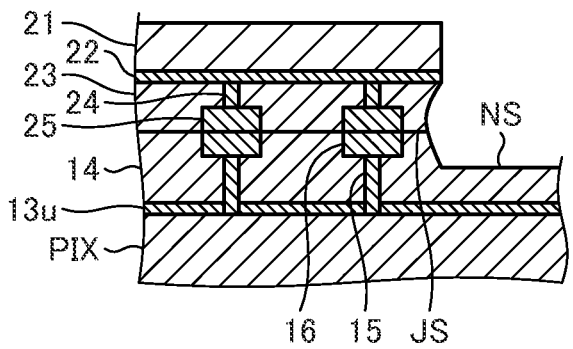

As illustrated in FIG. 10C, in order to remove the grinding dust D, the cleaning processing is performed using a cleaning solution such as FPM.

At this time, for example, at least one of the cleaning time, the cleaning temperature, the concentration of the cleaning solution, and the like is adjusted, and the cleaning processing is completed with the silicon oxide layer 14 with a predetermined thickness remaining on the silicon nitride layer 13u. For the conditions of the cleaning processing at this time, the cleaning time, the cleaning temperature, the concentration of the cleaning solution, and the like sufficient to cause the terminal 16d to disappear from the surface of the silicon oxide layer 14 in the region where the exposed terminal 16d exists are set.

In the pixel substrate 10b of the second variation example, the silicon nitride layer 13u is arranged at a leg of the plug 15, and the silicon oxide layer 14 in the pixel substrate 10b is thicker than, for example, the silicon oxide layer 14 in the pixel substrate 10 of the embodiment. Therefore, it is possible to set conditions under which the terminal 16d can be caused to disappear even without completely removing the silicon oxide layer 14 in the pixel substrate 10b.

After the cleaning processing is completed, the non-joining surface NS including the surface of the silicon oxide layer 14 newly exposed by erosion is formed.

Figure 10D:
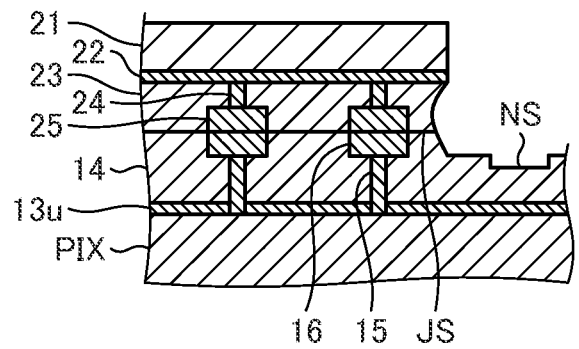
Figure 10E:
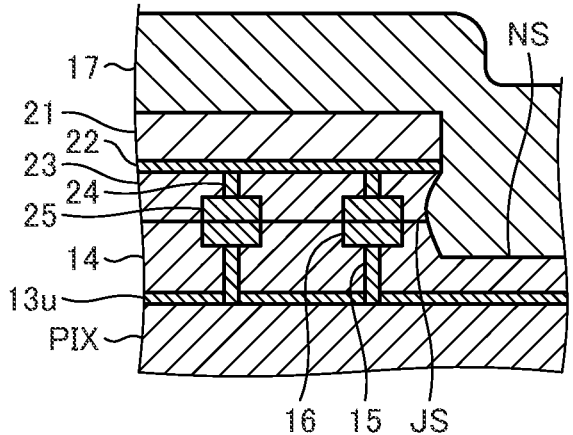
Figure 10F:
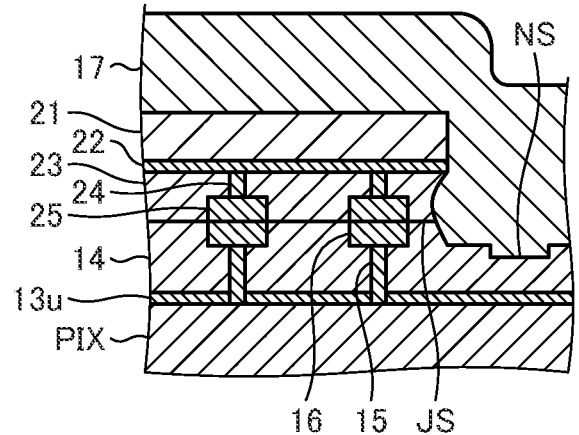

As illustrated in FIG. 10E, the insulating layer 17 that covers the entire logic substrate 20 and the non-joining surface NS of the pixel substrate is formed. Here, since the silicon oxide layer 14 having a predetermined thickness remains on the silicon nitride layer 13u, the difference in height between the joining surface JS and the non-joining surface NS is smaller than, for example, that of the above-described first variation example. Therefore, the step of the insulating layer 17 at this stage is smaller than that of the above-described first variation example.

Figure 10G:
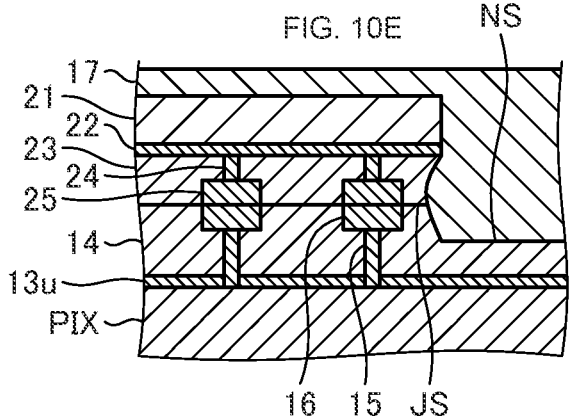

As illustrated in FIG. 10G, the insulating layer 17 is planarized.

Next, the cleaning processing for the region where the exposed terminal 16d exists will be described.

As illustrated in FIG. 10B, for example, after grinding the logic substrate 20, the grinding dust D such as of silicon exists around the logic substrate 20 and the pre-individualization pixel substrate.

As illustrated in FIG. 10D, in order to remove the grinding dust D, the cleaning processing is performed using a cleaning solution such as FPM. For example, since at least one of the cleaning time, the cleaning temperature, the concentration of the cleaning solution, and the like is adjusted as described above, the terminal 16d is completely dissolved or the silicon oxide layer 14, which is the base of the terminal 16d, is eroded and the terminal 16d is separated from the silicon oxide layer 14.

After the cleaning processing is completed, the terminal 16d disappears from the silicon oxide layer 14. Then, the non-joining surface NS including the surface of the silicon oxide layer 14 newly exposed by erosion by the cleaning solution is formed. As described above, in the configuration of the second variation example, the non-joining surface NS includes the surface of the generally eroded silicon oxide layer 14.

As illustrated in FIG. 10E, the insulating layer 17 that covers the entire logic substrate 20 and the non-joining surface NS of the pixel substrate is formed.

Figure 10H:
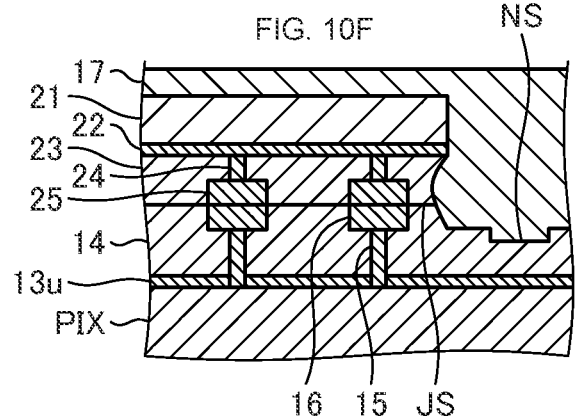

As illustrated in FIG. 10H, the insulating layer 17 is planarized.

Thus, the cleaning processing in the manufacturing processing for the solid-state image sensor 50b is completed.

In the solid-state image sensor 50b of the second variation example, the silicon oxide layer 14 having a predetermined thickness remains on the silicon nitride layer 13u in the region where the exposed terminal 16d does not exist. Therefore, the thickness of the insulating layer 17 can be reduced, and the film formation of the insulating layer 17 becomes easy. Further, the step of the insulating layer 17 can be reduced, and the planarization of the insulating layer 17 becomes easy.

The solid-state image sensor 50b of the second variation example includes the silicon nitride layer 13u arranged at a leg of the plug 15. Ideally, the silicon nitride layer 13u is not exposed in the method of the second variation example. However, when the difference in amount of removal of the silicon oxide layer 14 in the layer thickness direction occurs, or the like, the silicon nitride layer 13u functions as a stopper layer, and damage to the pixel circuit PIX can be suppressed. As described above, in the configuration of the second variation example, the process margin can be widened by having the silicon nitride layer 13u.

Third Variation Example

Next, a solid-state image sensor 50c of a third variation example of the embodiment will be described in conjunction with FIGS. 11, 12A, 12B, 12C, 12D, 12E, 12F, 12G, and 12H. The solid-state image sensor 50c of the third variation example is different from the above-described first variation example in that a silicon nitride layer 13t, which is a first insulating layer, is thicker.

Figure 11:
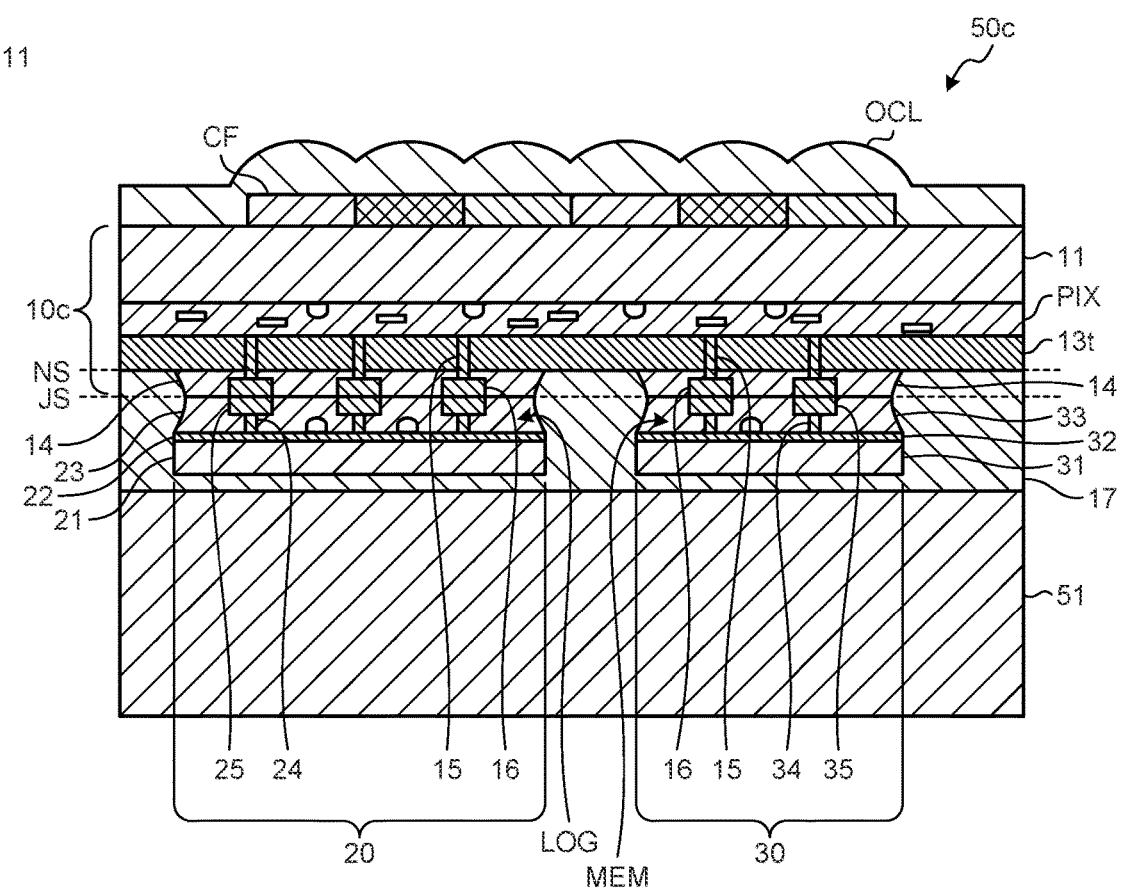
FIG. 11 is a schematic diagram illustrating a configuration example of a solid-state image sensor according to a third variation example of the embodiment of the present disclosure.

FIG. 11 is a schematic diagram illustrating a configuration example of the solid-state image sensor 50b according to the third variation example of the embodiment. As illustrated in FIG. 1, a pixel substrate 10c of the third variation example includes the silicon nitride layer 13t arranged at a leg of the plug 15. However, the silicon nitride layer 13t is formed thicker than, for example, the silicon nitride layer 13u of the above-described second and third variation examples. Then, the silicon oxide layer 14 is formed thinner by that amount than the silicon oxide layer 14 of the above-described second and third variation examples.

In the pixel substrate 10c, the surface of the silicon oxide layer 14 including the terminal 16 is the joining surface JS. Further, in a region where the silicon oxide layer 14 is not partially arranged on the silicon nitride layer 13t or the like, at least the surface of the silicon nitride layer 13t is the non-joining surface NS.

End faces of the silicon oxide layers 14, 23, and 33 facing the silicon nitride layer 13t, which is the non-joining surface NS, have a recess shape curved into the inside of each layer 14, 23, and 33.

FIGS. 12A, 12B, 12C, 12D, 12E, 12F, 12G and 12H are flowcharts illustrating an example of the procedure of the cleaning processing in the manufacturing processing for the solid-state image sensor 50c according to the third variation example of the embodiment of the present disclosure.

First, the cleaning processing for the region where the exposed terminal 16d does not exist will be described.

Figure 12A:
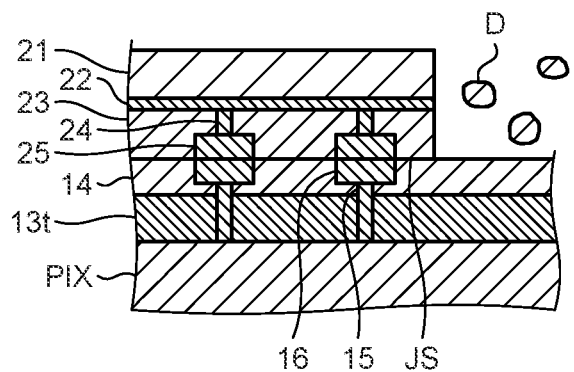
FIGS. 12A, 12B, 12C, 12D, 12E, 12F, 12G, and 12H are flowcharts illustrating an example of a procedure of cleaning processing in manufacturing processing for the solid-state image sensor according to the third variation example of the embodiment of the present disclosure.

As illustrated in FIG. 12A, for example, after grinding the logic substrate 20, the grinding dust D such as of silicon exists around the logic substrate 20 and the pre-individualization pixel substrate.

Figure 12B:
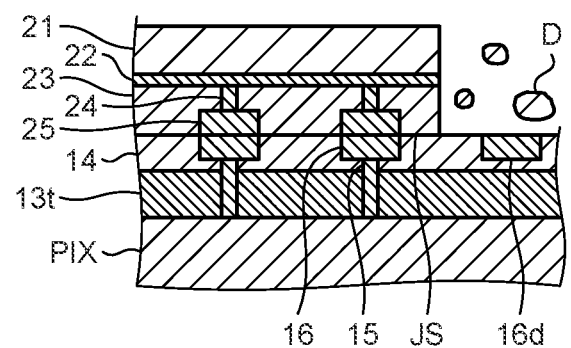
Figure 12C:
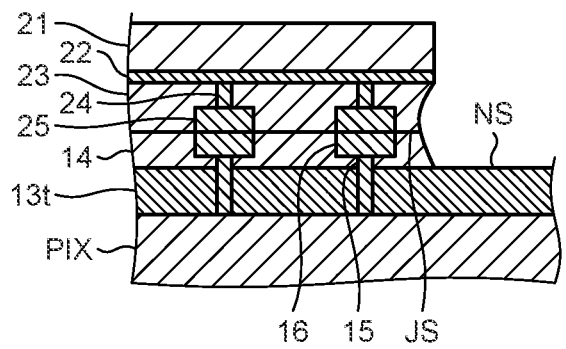

As illustrated in FIG. 12C, in order to remove the grinding dust D, the cleaning processing is performed using a cleaning solution such as FPM.

At this time, for example, at least one of the cleaning time, the cleaning temperature, the concentration of the cleaning solution, and the like is adjusted, and the cleaning processing is continued until the silicon oxide layer 14 is completely removed in a layer thickness direction. The silicon nitride layer 13t functions as a stopper layer and suppresses erosion of the pixel circuit PIX or the like, which is a layer underlying the silicon nitride layer 13t.

After the cleaning processing is completed, the non-joining surface NS including the surface of the silicon nitride layer 13t exposed by erosion of the silicon oxide layer 14 is formed.

As illustrated in FIG. 12(Ca)E, the insulating layer 17 that covers the entire logic substrate 20 and the non-joining surface NS of the pixel substrate is formed. Here, since the silicon nitride layer 13t is formed thicker than the silicon nitride layer 13u of the first variation example, the difference in height between the joining surface JS and the non-joining surface NS is smaller than, for example, that of the above-described first variation example. Therefore, the step of the insulating layer 17 at this stage is smaller than that of the above-described first variation example.

Figure 12D:
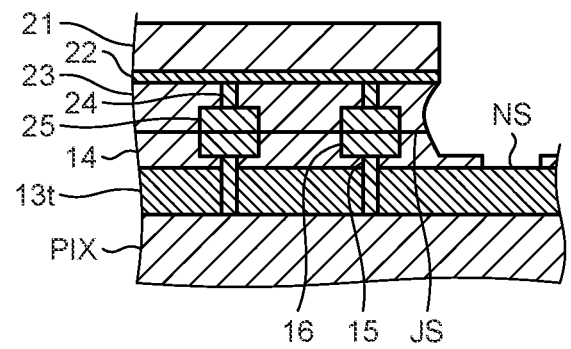
Figure 12E:
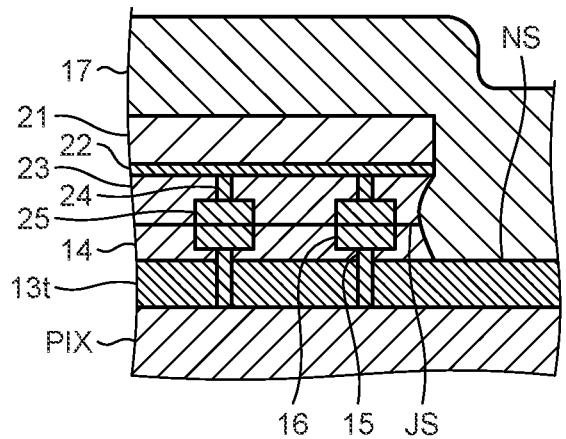
Figure 12F:
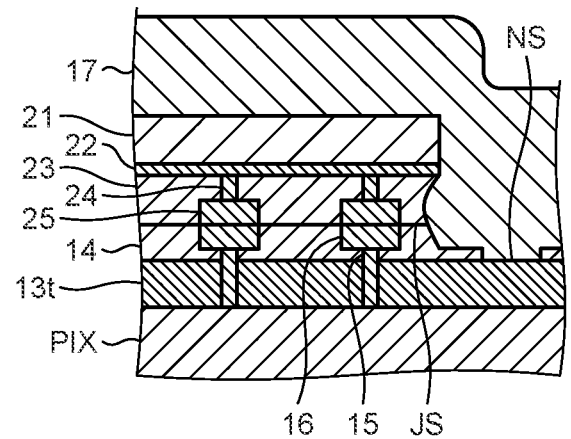
Figure 12G:
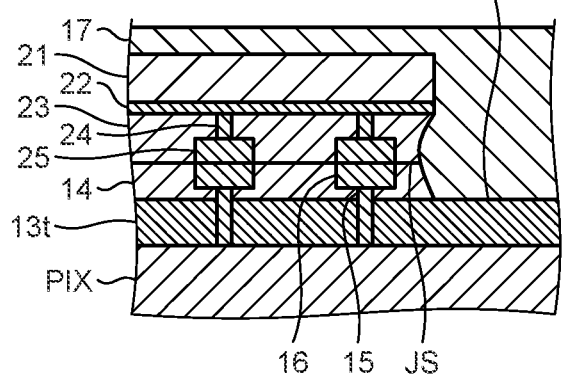

As illustrated in FIG. 12G, the insulating layer 17 is planarized.

Next, the cleaning processing for the region where the exposed terminal 16d exists will be described.

As illustrated in FIG. 12B, for example, after grinding the logic substrate 20, the grinding dust D such as of silicon exists around the logic substrate 20 and the pre-individualization pixel substrate.

As illustrated in FIG. 12D, in order to remove the grinding dust D, the cleaning processing is performed using a cleaning solution such as FPM. The terminal 16d is completely dissolved, or the silicon oxide layer 14, which is the base of the terminal 16d, is eroded and the terminal 16d is separated from the silicon oxide layer 14.

After the cleaning processing is completed, the terminal 16d disappears from the silicon oxide layer 14. Then, the non-joining surface NS including the surface of the silicon oxide layer 14 newly exposed as a result of erosion by the cleaning solution and the surface of the silicon nitride layer 13t exposed as a result of the removal of the silicon oxide layer 14 is formed. As described above, the non-joining surface NS may include the surface of the eroded silicon oxide layer 14 in a part of the region.

As illustrated in FIG. 12E, the insulating layer 17 that covers the entire logic substrate 20 and the non-joining surface NS of the pixel substrate is formed.

Figure 12H:
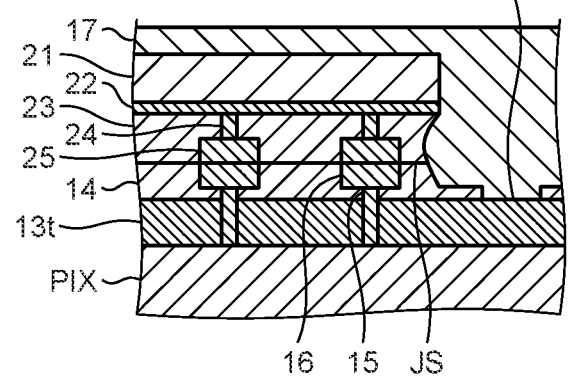

As illustrated in FIG. 12H, the insulating layer 17 is planarized.

Thus, the cleaning processing in the manufacturing processing for the solid-state image sensor 50c is completed.

As described above, the solid-state image sensor 50c of the third variation example also has the same effect as that of the above-described embodiment.

Further, in the solid-state image sensor 50c of the third variation example, the silicon nitride layer 13t is thickened and the silicon oxide layer 14 is formed thinner than, for example, the silicon oxide layer 14 of the first variation example. Therefore, the thickness of the insulating layer 17 can be reduced, and the film formation of the insulating layer 17 becomes easy. Further, the step of the insulating layer 17 can be reduced, and the planarization of the insulating layer 17 becomes easy.

Other Embodiments

In the above-described embodiment and first to third variation examples, the silicon nitride layers 13, 13u, 13t, and the like are inserted as the stopper layer, but they are not limited to this. As the stopper layer, a layer made of a material whose dissolution rate by a chemical solution for dissolving the terminal 16d is slower than that of the silicon oxide layer 14 can be used. Specific examples include, for example, a hydrogen-containing silicon nitride (SiNH) layer, a silicon carbon nitride (SiCN) layer, a hydrogen-containing silicon carbon nitride (SiCNH) layer, and the like.

In the above-described embodiment and first to third variation examples, the pre-individualization pixel substrate, the individualized logic substrate, and the individualized memory substrate are joined (Chip on Wafer), but they are not limited to this. In the manufacturing processing for the solid-state image sensor, the pixel substrate, the logic substrate, and the memory substrate may all be individualized and then joined (Chip to Chip). Alternatively, the pixel substrate, the logic substrate, and the memory substrate may all be joined in a pre-individualization state (Wafer to Wafer).

In the above-described embodiment and first to third variation examples, the solid-state image sensors in which the pixel substrates, the logic substrates, and the memory substrates are joined are given as examples, but they are not limited to this. The combination and number of substrates to be joined are arbitrary. Specifically, in addition to a combination of the pixel substrate, at least one logic substrate, and at least one memory substrate, examples include a combination of the pixel substrate and at least one logic substrate, a combination of the pixel substrate and at least one memory substrate, and a combination of at least one logic substrate and at least one memory substrate.

Note that the effects described in the present specification are merely examples and are not limitative, and there may be other effects.

Further, the present technology can also have the following configurations.

(1)
A semiconductor device comprising:
a first substrate configured to be individualized and include a first semiconductor circuit including a first terminal; and
a second substrate configured to include a second semiconductor circuit including a second terminal, wherein the first terminal and the second terminal are joined, and the second substrate includes:
a first insulating layer that is arranged above the second substrate, and
a second insulating layer that is arranged at least partially above the first insulating layer and in which the second terminal is arranged.

(2)
The semiconductor device according to (1), wherein the second substrate includes:
a joining surface joined to the first substrate, and
a non-joining surface arranged on the second substrate side with respect to the joining surface.

(3)
The semiconductor device according to (2), wherein the joining surface includes the second insulating layer, and
the non-joining surface includes at least the first insulating layer.

(4)
The semiconductor device according to (2), wherein the joining surface and the non-joining surface include the second insulating layer.

(5)
The semiconductor device according to (2), wherein the non-joining surface includes no metal member.

(6)
The semiconductor device according to any one of (1) to (5), wherein
a dissolution rate of the first insulating layer by a chemical solution that dissolves the second terminal is lower than a dissolution rate of the second insulating layer by the chemical solution.

(7)
The semiconductor device according to any one of (1) to (6), wherein
the first substrate includes:
a third insulating layer that is arranged above the first substrate, and
a fourth insulating layer that is arranged at least partially above the third insulating layer and in which the first terminal is arranged.

(8)
The semiconductor device according to (7), wherein the first substrate includes a joining surface joined to the second substrate.

(9)
The semiconductor device according to (8), wherein the joining surface of the first substrate includes the fourth insulating layer.

(10)
The semiconductor device according to any one of (7) to (9), wherein
a dissolution rate of the third insulating layer by a chemical solution that dissolves the second terminal is lower than a dissolution rate of the fourth insulating layer by the chemical solution.

(11)
The semiconductor device according to any one of (1) to (10), wherein
the second semiconductor circuit includes a pixel circuit.

(12)
The semiconductor device according to any one of (1) to (11), wherein
the first semiconductor circuit includes a logic circuit.

(13)
The semiconductor device according to any one of (1) to (11), wherein
the first semiconductor circuit includes a memory circuit.

(14)
The semiconductor device according to any one of (1) to (13), wherein
an area of the second substrate is larger than an area of the first substrate.

(15)
The semiconductor device according to any one of (1) to (13), wherein
the second substrate is individualized, and
an area of the second substrate is larger than an area of the first substrate.

(16)
A semiconductor device comprising:
a first substrate configured to be individualized and include a first semiconductor circuit including a first terminal; and
a second substrate configured to include a second semiconductor circuit including a second terminal, wherein
the first terminal and the second terminal are joined,
the second substrate includes:
a joining surface joined to the first substrate, and
a non-joining surface arranged on the second substrate side with respect to the joining surface, and
in the non-joining surface,
after the first terminal and the second terminal are joined,
the first insulating layer arranged above the second substrate is a stopper layer, and a second insulating layer that is arranged above the first insulating layer and in which a third terminal not included in the second semiconductor circuit is arranged is processed by a chemical solution that dissolves the second terminal.

(17)
The semiconductor device according to (16), wherein
by processing using the chemical solution,
the third terminal has disappeared from the non-joining surface.

(18)
The semiconductor device according to (16) or (17), wherein
the joining surface includes the second insulating layer, and
the non-joining surface includes at least the first insulating layer.

(19)

The semiconductor device according to (16) or (17), wherein
the joining surface and the non-joining surface include the second insulating layer.

(20)

A solid-state image sensor comprising:
at least one of a logic substrate configured to be individualized and include a logic circuit including a first terminal and a memory substrate configured to be individualized and include a memory circuit including a first terminal; and
a pixel substrate configured to include a pixel circuit including a second terminal, wherein
the first terminal and the second terminal are joined, and
the pixel substrate includes:
a first insulating layer that is arranged above the pixel substrate, and
a second insulating layer that is arranged at least partially above the first insulating layer and in which the second terminal is arranged.

REFERENCE SIGNS LIST

10 PIXEL SUBSTRATE
13, 13t, 13u SILICON NITRIDE LAYER
14 SILICON OXIDE LAYER
16, 16d, 25, 35 TERMINAL
20 LOGIC SUBSTRATE
30 MEMORY SUBSTRATE
50, 50a, 50b, 50c SOLID-STATE IMAGE SENSOR
JS JOINING SURFACE
LOG LOGIC CIRCUIT
MEM MEMORY CIRCUIT
NS NON-JOINING SURFACE
PIX PIXEL CIRCUIT

The invention claimed is:

1. A semiconductor device, comprising:
a first substrate including a first semiconductor circuit, wherein
the first semiconductor circuit includes a first terminal, and
the first substrate is individualized into a first chip; and
a second substrate including a second semiconductor circuit, wherein
the second semiconductor circuit includes a second terminal,
the first terminal is joined to the second terminal,
the second substrate further includes:
a first insulating layer between the second substrate and the first substrate; and
a second insulating layer between the first insulating layer and the first substrate,
the second terminal is in the second insulating layer,
the second terminal is between the first insulating layer and the first terminal, and
the second terminal faces the second substrate.

2. The semiconductor device according to claim 1, wherein
the second substrate further includes:
a joining surface joined to the first substrate; and
a non-joining surface on a side of the second substrate, and
the non-joining surface is opposite to the joining surface.

3. The semiconductor device according to claim 2, wherein
the joining surface includes a surface of the second insulating layer, and
the non-joining surface includes a surface of the first insulating layer.

4. The semiconductor device according to claim 2, wherein
the joining surface includes a first surface of the second insulating layer, and
the non-joining surface includes a second surface of the second insulating layer.

5. The semiconductor device according to claim 2, wherein
the non-joining surface includes a surface of the second insulating layer, and
the surface of the second insulating layer faces the second substrate.

6. The semiconductor device according to claim 1, wherein a dissolution rate of the first insulating layer by a chemical solution is lower than a dissolution rate of the second insulating layer by the chemical solution.

7. The semiconductor device according to claim 1, wherein
the first substrate further includes:
a third insulating layer above the first substrate; and
a fourth insulating layer at least partially above the third insulating layer, and
the first terminal is in the fourth insulating layer.

8. The semiconductor device according to claim 7, wherein
the first substrate further includes a joining surface, and
the joining surface is joined to the second substrate.

9. The semiconductor device according to claim 8, wherein the joining surface of the first substrate includes a surface of the fourth insulating layer.

10. The semiconductor device according to claim 7, wherein a dissolution rate of the third insulating layer by a chemical solution is lower than a dissolution rate of the fourth insulating layer by the chemical solution.

11. The semiconductor device according to claim 1, wherein the second semiconductor circuit is a pixel circuit.

12. The semiconductor device according to claim 1, wherein the first semiconductor circuit is a logic circuit.

13. The semiconductor device according to claim 1, wherein the first semiconductor circuit is a memory circuit.

14. The semiconductor device according to claim 1, wherein an area of the second substrate is larger than an area of the first substrate.

15. The semiconductor device according to claim 1, wherein
the second substrate is individualized into a second chip, and
an area of the second substrate is larger than an area of the first substrate.

16. A semiconductor device, comprising:
a first substrate including a first semiconductor circuit, wherein
the first semiconductor circuit includes a first terminal, and
the first substrate is individualized into a chip; and
a second substrate including a second semiconductor circuit, wherein
the second semiconductor circuit includes a second terminal,
the first terminal is joined to the second terminal, the second substrate further includes:
   a joining surface joined to the first substrate;
   a non-joining surface on a side of the second substrate;
   a first insulating layer between the second substrate and the first substrate; and
   a second insulating layer between the first insulating layer and the first substrate,
the non-joining surface is opposite to the joining surface,
the first insulating layer is a stopper layer,
the second insulating layer includes a third terminal, and
the third terminal is electrically isolated from the second semiconductor circuit.

17. The semiconductor device according to claim 16, wherein the third terminal is removed from the non-joining surface.

18. The semiconductor device according to claim 16, wherein
   the joining surface includes a surface of the second insulating layer, and
   the non-joining surface includes a surface of the first insulating layer.

19. The semiconductor device according to claim 16, wherein
   the joining surface includes a first surface of the second insulating layer, and
   the non-joining surface includes a second surface of the second insulating layer.

20. A solid-state image sensor, comprising:
at least one of a logic substrate which includes a logic circuit or a memory substrate which includes a memory circuit, wherein
   the logic circuit includes a first terminal,
   the memory circuit includes a third terminal, and
   the at least one of the logic substrate or the memory substrate is individualized to a chip; and
a pixel substrate which includes a pixel circuit, wherein
   the pixel circuit includes a second terminal,
   at least one of the first terminal or the third terminal is joined to the second terminal,
   the pixel substrate further includes:
      a first insulating layer between the pixel substrate and the at least one of the logic substrate or the memory substrate; and
      a second insulating layer between the first insulating layer and the at least one of the logic substrate or the memory substrate,
   the second terminal is in the second insulating layer,
   the second terminal is between the first insulating layer and the first terminal, and
   the second terminal faces the pixel substrate.

* * * * *